United States Patent [19]

Bahl et al.

[11] Patent Number: 5,280,562

[45] Date of Patent: Jan. 18, 1994

[54] SPEECH CODING APPARATUS WITH SINGLE-DIMENSION ACOUSTIC PROTOTYPES FOR A SPEECH RECOGNIZER

[75] Inventors: Lalit R. Bahl, Amawalk; Jerome R. Bellegarda, Goldens Bridge; Edward A. Epstein, Putnam Valley; John M. Lucassen, Yorktown Heights; David Nahamoo; Michael A. Picheny, both of White Plains, all of N.Y.

[73] Assignee: International Business Machines Corporation, Armonk, N.Y.

[21] Appl. No.: 770,495

[22] Filed: Oct. 3, 1991

[51] Int. Cl.$^5$ .................................................. G10L 9/02
[52] U.S. Cl. .................................................. 395/2
[58] Field of Search .................................. 381/29–52; 395/2

[56] References Cited

U.S. PATENT DOCUMENTS

| 4,759,068 | 7/1988 | Bahl et al. | 381/43 |
|---|---|---|---|
| 4,926,488 | 5/1990 | Nadas et al. | 381/41 |
| 4,977,599 | 12/1990 | Bahl et al. | 381/43 |
| 4,980,918 | 12/1990 | Bahl et al. | 381/43 |
| 5,031,217 | 7/1991 | Nishimura | 381/43 |
| 5,182,773 | 1/1993 | Bahl et al. | 381/43 |

OTHER PUBLICATIONS

Bahl, L. R., et al. "Acoustic Markov Models Used in the Tangora Speech Recognition System", Proceedings 1988 International Conference on Acoustics, Speech, and Signal Processing, New York, N.Y., pp. 497–500, Apr. 1988.

Bahl, L. R., et al., "Fast Algorithm For Deriving Acoustic Prototypes for Automatic Speech Recognition", U.S. patent application Ser. No. 730,714, filed Jul. 16, 1991.

Bahl, L. R., et al., "A Maximum Likelihood Approach to Continuous Speech Recognition", IEEE Transactions on Pattern Analysis and Machine Intelligence, vol. PAMI-5, No. 2, pp. 179–190, Mar. 1983.

Bahl, L. R., et al., "speaker–Independent Label Coding Apparatus", U.S. patent application Ser. No. 673,810, filed Mar. 22, 1991.

Bahl, L. R., et al., "Vector Quantization Procedure For Speech Recognition Systems Using Discrete Parameter Phoneme–Based Markov Word Models", IBM Technical Disclosure Bulletin, vol. 32, No. 7, Dec. 1989, pp. 320–321.

Brown, P. F., et al., "Automatic Determination of Fenemic Labels and Fenemic–Based Markov Word Models for Speech Recognition", U.S. patent application Ser. No. 431,720, filed Nov. 2, 1989.

Jelinek, F., "The Development of an Experimental Discrete Dictation Recognizer", Proceedings IEEE, vol. 73, No. 11, pp. 1616–1624, Nov. 1985.

Nadas, A., et al., "Continuous Speech Recognition with automatically Selected Prototypes Using Either Boot strapping or Clustering", Proceedings 1981 International Conference on Acoustics, Speech, and Signal Processing, Atlanta, Ga., pp. 1153–1156, Apr. 1981.

*Primary Examiner*—Michael R. Fleming
*Assistant Examiner*—Michelle Doerrler
*Attorney, Agent, or Firm*—Marc D. Schechter

[57] ABSTRACT

In speech recognition and speech coding, the values of at least two features of an utterance are measured during a series of time intervals to produce a series of feature vector signals. A plurality of single-dimension prototype vector signals having only one parameter value are stored. At least two single-dimension prototype vector signals having parameter values representing first feature values, and at least two other single-dimension prototype vector signals have parameter values representing second feature values. A plurality of compound-dimension prototype vector signals have unique identification values and comprise one first-dimension and one second-dimension prototype vector signal. At least two compound-dimension prototype vector signals comprise the same first-dimension prototype vector signal. The feature values of each feature vector signal are compared to the parameter values of the compound-dimension prototype vector signals to obtain prototype match scores. The identification values of the compound-dimension prototype vector signals having the best prototype match scores for the feature vectors signals are output as a sequence of coded representations of an utterance to be recognized. A match score, comprising an estimate of the closeness of a match between a speech unit and the sequence of coded representations of the utterance, is generated for each of a plurality of speech units. At least one speech subunit, of one or more best candidate speech units having the best match scores, is displayed.

28 Claims, 2 Drawing Sheets

SPEECH CODING APPARATUS WITH SINGLE-DIMENSION ACOUSTIC PROTOTYPES FOR A SPEECH RECOGNIZER

BACKGROUND OF THE INVENTION

The invention relates to multidimensional vector quantization type speech coding devices used in, for example, automatic speech recognizers.

In vector quantization type speech coding devices, a number of different features of an utterance are measured during each of a series of successive time intervals to produce a series of feature vector signals represeting the feature values of the utterance. A plurality of multidimensional prototype vector signals are stored, where each dimension of a prototype vector signal has a parameter value representing one of the features being measured. The identity of the prototype vector signal having parameter values which are closest to a given feature vector signal is output as a "label" of that feature vector signal.

As the number of prototype vector signals increases, and as the number of different features (dimensions) increases, the vector quantization process (and therefore speech recognition) becomes more costly and more time-consuming. Moreover, the storage of vector quantization prototype vector signals occupies increasing electronic memory.

SUMMARY OF THE INVENTION

It is an object of the invention to provide a speech coding apparatus for coding speech at a relatively fast rate of time.

It is another object of the invention to provide a speech coding apparatus for storing acoustic prototype vector signals in relatively limited electronic memory.

According to the present invention, a speech coding apparatus comprises means for measuring the values of at least first and second different features of an utterance during each of a series of successive time intervals to produce a series of feature vector signals representing the feature values. A plurality of single-dimension prototype vector signals are stored. Each single-dimension prototype vector signal has at least one parameter value. At least two single-dimension prototype vector signals are first-dimension prototype vector signals having parameter values representing first feature values. At least two other single-dimension prototype vector signals are second-dimension prototype vector signals having parameter values representing second feature values.

A plurality of compound-dimension prototype vector signals are also stored. Each compound-dimension prototype vector signal has a unique identification value, and comprises one first-dimension prototype vector signal and one second-dimension prototype vector signal. At least two-compound dimension prototype vector signals comprise the same first-dimension prototype vector signal.

Means are provided for comparing the closeness of the feature values of a feature vector signal to the parameter values of the compound-dimension prototype vector signals to obtain prototype match scores for the feature vector signal and each compound-dimension prototype vector signal. At least the identification value of the compound-dimension prototype vector signal having the best prototype match score is output as a coded representation signal of the feature vector signal.

In one aspect of the invention, the means for comparing the feature vector signals to the prototype vector signals comprises means for comparing the value of the first feature of a feature vector signal with the parameter value of each first-dimension prototype vector signal exactly one time only. Means are also provided for comparing the value of the second feature of a feature vector signal with the parameter value of each second-dimension prototype vector signal exactly one time only.

In another aspect of the invention, a plurality of single-dimension prototype vector signals are contained in two or more compound-dimension prototype vector signals.

In a further aspect of the invention, each compound-dimension prototype vector signal contains at least one single-dimension prototype vector signal which is also contained in at least some other compound-dimension prototype vector signal.

For each dimension, the number of single-dimension prototype vector signals may be, for example, less than one-half the number of compound-dimension prototype vector signals.

The means for measuring the features of an utterance may include a microphone.

A speech recognition apparatus and method according to the present invention comprises a speech coding apparatus and method as described above. Moreover, the speech recognition apparatus and method further includes means for generating a match score for each of a plurality of speech units. Each match score comprises an estimate of the closeness of a match between the speech unit and a sequence of coded representations of the utterance. Each speech unit comprises one or more speech subunits.

Means are also provided for identifying one or more best candidate speech units having the best match scores, and for displaying at least one speech subunit of one or more of the best candidate speech units.

The speech coding and speech recognition apparatus and method according to the present invention are advantageous because by constructing all compound-dimension prototype vector signals from a limited set of single-dimension prototype vector signals, the rate of time of encoding speech is increased. Moreover, all of the single-dimension prototype vector signals and all of the compound-dimension prototype vector signals can be stored in a relatively small electronic memory.

DESCRIPTION OF THE PREFERRED EMBODIMENTS

Figure 1:
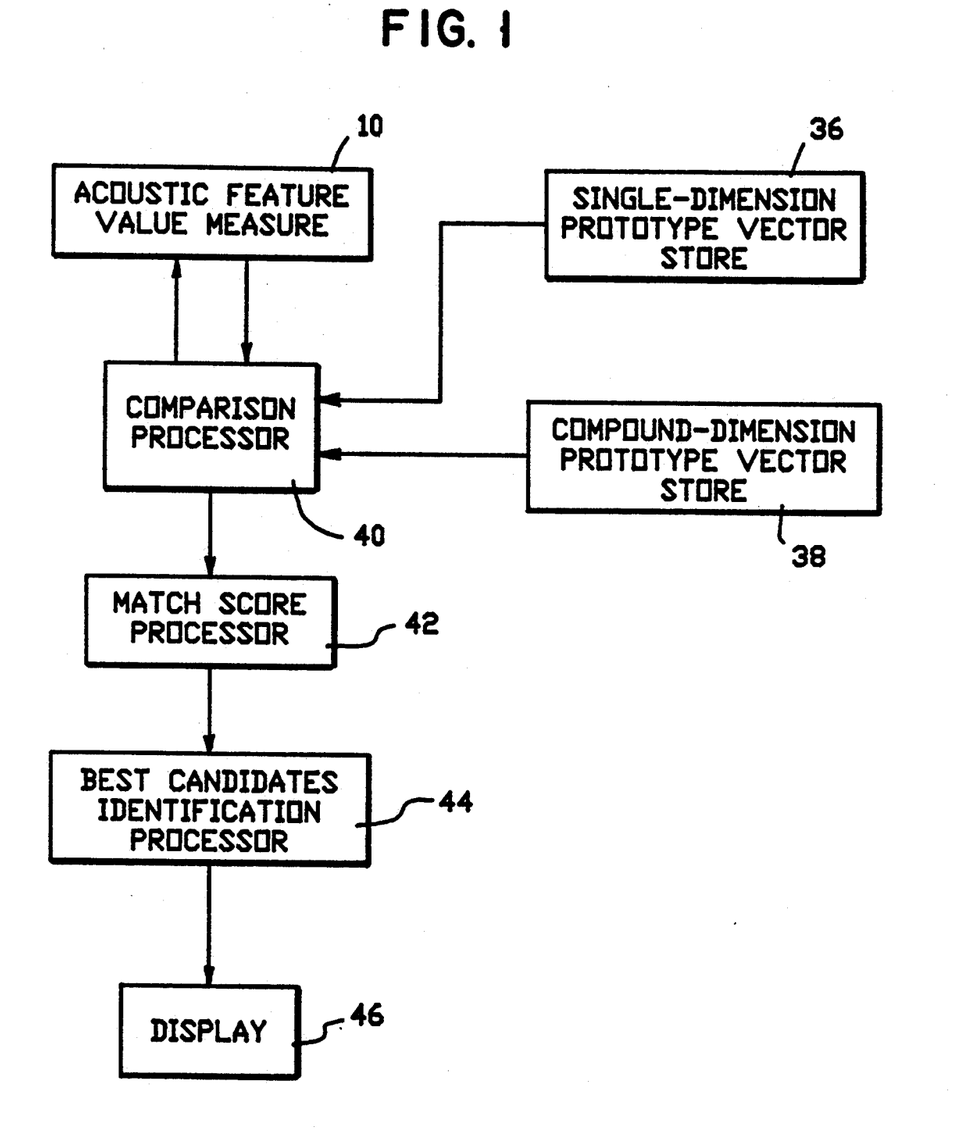
FIG. 1 is a block diagram of an example of a speech recognition apparatus according to the present invention containing a speech coding apparatus according to the present invention.

FIG. 1 shows an example of a speech recognition apparatus according to the present invention containing a speech coding apparatus according to the present invention. Means 10 is provided for measuring the values of at least first and second different features of an utterance during each of a series of successive time intervals to produce a series of feature vector signals representing the feature values.

Figure 2:
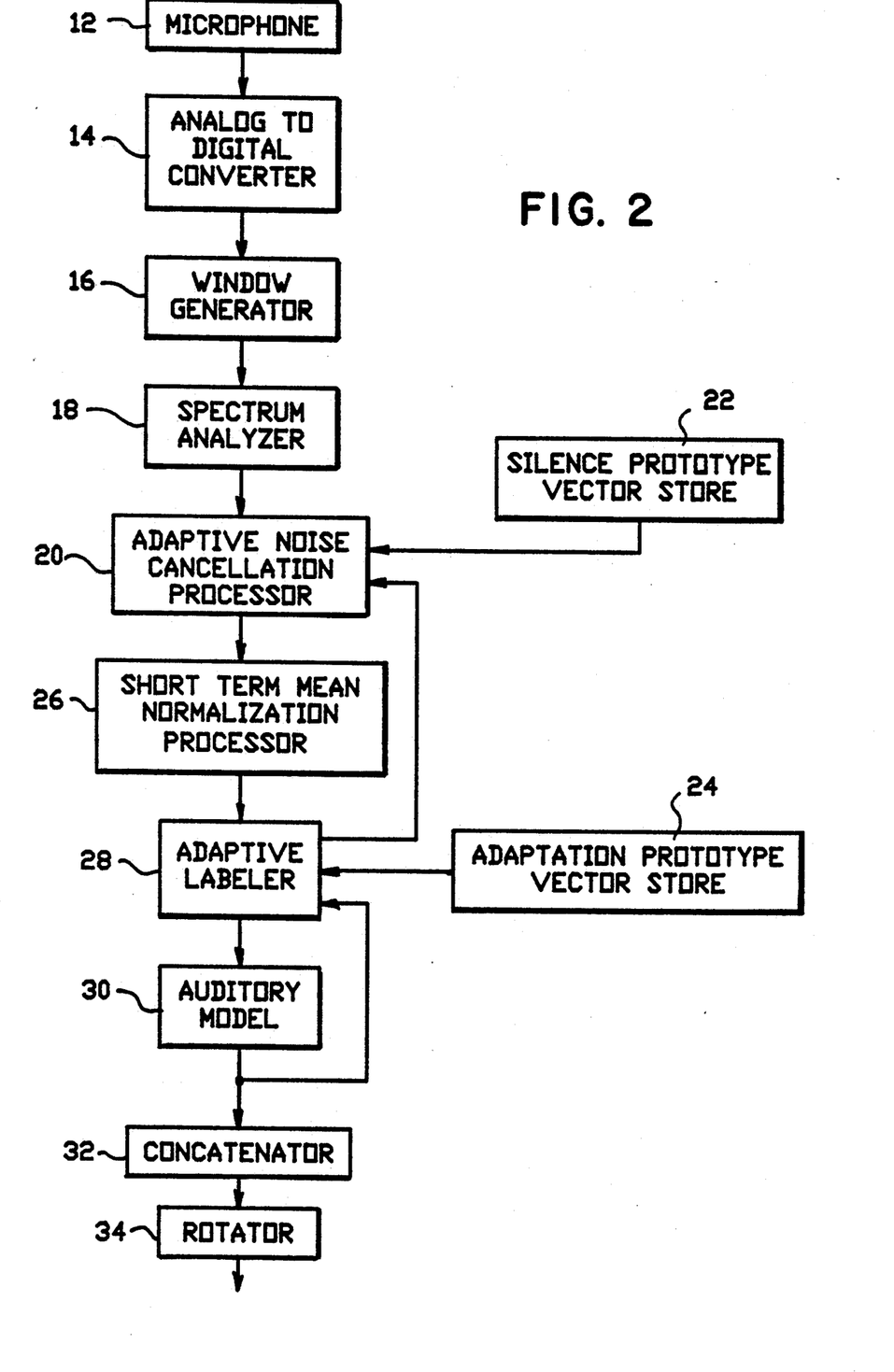
FIG. 2 is a block diagram of an example of a means for measuring the values of features of an utterance.

One example of an acoustic feature value measuring means is shown in FIG. 2. The measuring means includes a microphone 12 for generating an analog electrical signal corresponding to the utterance. The analog electrical signal from microphone 12 is converted to a digital electrical signal by analog to digital converter 14. For this purpose, the analog signal may be sampled, for example, at a rate of twenty kilohertz by the analog to digital converter 14.

A window generator 16 obtains, for example, a twenty millisecond duration sample of the digital signal from analog to digital converter 14 every ten milliseconds (one centisecond). Each twenty millisecond sample of the digital signal is analyzed by spectrum analyzer 18 in order to obtain the amplitude of the digital signal sample in each of, for example, twenty frequency bands. Preferably, spectrum analyzer 18 also generates a twenty-first dimension signal representing the total amplitude or total power of the ten millisecond digital signal sample. The spectrum analyzer 18 may be, for example, a fast Fourier transform processor. Alternatively, it may be a bank of twenty band pass filters.

The twenty-one dimension vector signals produced by spectrum analyzer 18 may be adapted to remove background noise by an adaptive noise cancellation processor 20. Noise cancellation processor 20 subtracts a noise vector N(t) from the feature vector F(t) input into the noise cancellation processor to produce an output feature vector F'(t). The noise cancellation processor 20 adapts to changing noise levels by periodically updating the noise vector N(t) whenever the prior feature vector F(t−1) is identified as noise or silence. The noise vector N(t) is updated according to the formula $$N(t) = \frac{N(t-1) + k[F(t-1) - Fp(t-1)]}{(1+k)},$$ [1]

where N(t) is the noise vector at time t, N(t−1) is the noise vector at time (t−1), k is a fixed parameter of the adaptive noise cancellation model, F(t−1) is the feature vector input into the noise cancellation processor 20 at time (t−1) and which represents noise or silence, and Fp(t−1) is one silence prototype vector, from store 22, closest to feature vector F(t−1).

The prior feature vector F(t−1) is recognized as noise or silence if either (a) the total energy of the vector is below a threshold, or (b) the closest prototype vector in adaptation prototype vector store 24 to the feature vector is a prototype representing noise or silence. For the purpose of the analysis of the total energy of the feature vector, the threshold may be, for example, the fifth percentile of all feature vectors (corresponding to both speech and silence) produced in the two seconds prior to the feature vector being evaluated.

After noise cancellation, the feature vector F'(t) is normalized to adjust for variations in the loudness of the input speech by short term mean normalization processor 26. Normalization processor 26 normalizes the twenty-one dimension feature vector F'(t) to produce a twenty dimension normalized feature vector X(t). The twenty-first dimension of the feature vector F'(t), representing the total amplitude or total power, is discarded. Each component i of the normalized feature vector X(t) at time t may, for example, be given by the equation $$X_i(t) = F'_i(t) - Z(t)$$ [2]

in the logarithmic domain, where $F'_i(t)$ is the i-th component of the unnormalized vector at time t, and where Z(t) is a weighted mean of the components of F'(t) and Z(t−1) according to Equations 3 and 4:

$$Z(t) = 0.9Z(t-1) + 0.1M(t)$$ [3]

and where $$M(t) = \frac{1}{20} \sum_i F'_i(t)$$ [4]

The normalized twenty dimension feature vector X(t) may be further processed by an adaptive labeler 28 to adapt to variations in pronunciation of speech sounds. An adapted twenty dimension feature vector X'(t) is generated by subtracting a twenty dimension adaptation vector A(t) from the twenty dimension feature vector X(t) provided to the input of the adaptive labeler 28. The adaptation vector A(t) at time t may, for example, be given by the formula $$A(t) = \frac{A(t-1) + k[X(t-1) - Xp(t-1)]}{(1+k)},$$ [5]

where k is a fixed parameter of the adaptive labeling model, X(t−1) is the normalized twenty dimension vector input to the adaptive labeler 28 at time (t−1), Xp(t−1) is the adaptation prototype vector (from adaptation prototype store 24) closest to the twenty dimension feature vector X(t−1) at time (t−1), and A(t−1) is the adaptation vector at time (t−1).

The twenty dimension adapted feature vector signal X'(t) from the adaptive labeler 28 is preferably provided to an auditory model 30. Auditory model 30 may, for example, provide a model of how the human auditory system perceives sound signals. An example of an auditory model is described in U.S. Pat. No. 4,980,918 to Bahl et al entitled "Speech Recognition System with Efficient Storage and Rapid Assembly of Phonological Graphs".

Preferably, according to the present invention, for each frequency band i of the adapted feature vector signal X'(t) at time t, the auditory model 30 calculates a new parameter $E_i(t)$ according to Equations 6 and 7:

$$E_i(t) = K_1 + K_2(X'_i(t))(N_i(t-1))$$ [6]

where $$N_i(t) = K_3 \times N_i(t-1) - E_i(t-1)$$ [7]

and where $K_1$, $K_2$, and $K_3$ are fixed parameters of the auditory model.

For each centisecond time interval, the output of the auditory model 30 is a modified twenty dimension feature vector signal. This feature vector is augmented by a twenty-first dimension having a value equal to the square root of the sum of the squares of the values of the other twenty dimensions.

For each centisecond time interval, a concatenator 32 preferably concatenates nine twenty-one dimension feature vectors representing the one current centisecond time interval, the four preceding centisecond time intervals, and the four following centisecond time intervals to form a single spliced vector of 189 dimensions. Each 189 dimensions spliced vector is preferably multiplied in a rotator 34 by a rotation matrix to rotate the spliced vector and to reduce the spliced vector to fifty dimensions.

The rotation matrix used in rotator 34 may be obtained, for example, by classifying into M classes a set of 189 dimension spliced vectors obtained during a training session. The covariance matrix for all of the spliced vectors in the training set is multiplied by the inverse of the sample within-class covariance matrix for all of the spliced vectors in all M classes. The first fifty eigenvectors of the resulting matrix form the rotation matrix. (See, for example, "Vector Quantization Procedure For Speech Recognition Systems Using Discrete Parameter Phoneme-Based Markov Word Models" by L. R. Bahl, et al, *IBM Technical Disclosure Bulletin*, Volume 32, No. 7, December 1989, pages 320 and 321.)

Window generator 16, spectrum analyzer 18, adaptive noise cancellation processor 20, short term mean normalization processor 26, adaptive labeler 28, auditory model 30, concatenator 32, and rotator 34, may be suitably programmed special purpose or general purpose digital signal processors. Prototype stores 22 and 24 may be electronic computer memory.

Table 1 shows a hypothetical example of a series of two dimension acoustic feature vectors U1 through U7 obtained at times t1 through t7. Each acoustic feature vector has a measured value for dimension Feature 1 and has a measured value for dimension Feature 2.

TABLE 1

| ACOUSTIC FEATURE VECTORS | | | | | | | |
|---|---|---|---|---|---|---|---|
|  | U1 | U2 | U3 | U4 | U5 | U6 | U7 |
| time | t1 | t2 | t3 | t4 | t5 | t6 | t7 |
| Feature 1 Value | 0.91 | 0.15 | 0.47 | 0.83 | 0.65 | 0.96 | 0.92 |
| Feature 2 Value | 0.64 | 0.89 | 0.84 | 0.74 | 0.62 | 0.38 | 0.53 |

Returning to FIG. 1, the speech recognition apparatus and speech coding apparatus according to the present invention further include means 36 for storing a plurality of single-dimension prototype vector signals. Each single-dimension prototype vector signal has only one parameter value. At least two single-dimension prototype vector signals are first-dimension prototype vector signals having parameter values representing first feature values. At least two other single-dimension prototype vector signals are second-dimension prototype vector signals having parameter values representing second feature values.

Table 2 is a hypothetical example of single-dimension prototype vectors. First-dimension prototype vectors P11, P12, P13, P14, and P15 have parameter values representing Feature 1 values only. Second-dimension prototype vectors P21, P22, P23, P24, and P25 have parameter values representing Feature 2 values only.

TABLE 2

| SINGLE-DIMENSION PROTOTYPE VECTORS | | | | | |
|---|---|---|---|---|---|
| Feature 1 Value | P11 | P12 | P13 | P14 | P15 |
|  | 0.015 | 0.23 | 0.43 | 0.763 | 0.97 |
| Feature 2 Value | P21 | P22 | P23 | P24 | P25 |
|  | 0.055 | 0.26 | 0.56 | 0.666 | 0.923 |

Means 38 are provided for storing a plurality of compound-dimension prototype vector signals. Each compound-dimension prototype vector signal has a unique identification value. Each compound-dimension prototype vector signal comprises one first-dimension prototype vector signal and one second-dimension prototype vector signal. At least two compound-dimension prototype vector signals comprise the first-dimension prototype vector signal.

Table 3 is a hypothetical example of compound-dimension prototype vector signals L1 through L10. Each compound-dimension prototype vector shown in Table 3 comprises an identification value L1 through L10, one Feature 1 single-dimension prototype vector, and one Feature 2 single-dimension prototype vector.

TABLE 3

| | COMPOUND-DIMENSION PROTOTYPE VECTORS | | | | | | | | | |
|---|---|---|---|---|---|---|---|---|---|---|
| Labels | L1 | L2 | L3 | L4 | L5 | L6 | L7 | L8 | L9 | L10 |
| Feature 1 | P14 | P15 | P11 | P13 | P14 | P11 | P14 | P12 | P12 | P15 |
| Feature 2 | P24 | P25 | P21 | P25 | P23 | P22 | P25 | P21 | P24 | P24 |

The invention further includes means 40 for comparing the closeness of the feature values of a feature vector signal to the parameter values of the compound-dimension prototype vector signals to obtain prototype match scores for the feature vector signal and each compound-dimension prototype vector signal. Comparison processor 40 outputs at least the identification value of the compound-dimension prototype vector signal having the best prototype match score as a coded representation signal of the feature vector signal.

Table 4 shows a hypothetical example of a comparison of the closeness of feature vector U1 from Table 1 with compound-dimension prototype vectors L1 through L10. As shown in Table 4, compound-dimension prototype vector L10 has the best prototype match score for feature vector U1. Therefore, the identification value L10 is output as a coded representation signal of the feature vector signal U1.

TABLE 4

| UTTERANCE FEATURE VECTOR U1 | | | | | |
|---|---|---|---|---|---|
| Measured Feature 1  0.91 | | | | | |
| Measured Feature 2  0.64 | | | | | |
|  | P11 | P12 | P13 | P14 | P15 |
| Prototype Feature 1 Value | 0.015 | 0.23 | 0.43 | 0.763 | 0.97 |
| U1 Feature 1 Value | 0.91 | 0.91 | 0.91 | 0.91 | 0.91 |
| Distances ($D_1$) | 0.895 | 0.68 | 0.48 | 0.146 | −0.06 |
|  | P21 | P22 | P23 | P24 | P25 |
| Prototype Feature 1 Value | 0.055 | 0.26 | 0.56 | 0.666 | 0.923 |
| U1 Feature 2 Value | 0.64 | 0.64 | 0.64 | 0.64 | 0.64 |
| Distances ($D_2$) | 0.585 | 0.38 | 0.08 | −0.02 | −0.28 |

DISTANCES FROM U1 TO COMPOUND-DIMENSION

TABLE 4-continued

| PROTOTYPE VECTORS | | | | | | | | | | |
|---|---|---|---|---|---|---|---|---|---|---|
| label | L1 | L2 | L3 | L4 | L5 | L6 | L7 | L8 | L9 | L10 |
| Feature 1 | P14 | P15 | P11 | P13 | P14 | P11 | P14 | P12 | P12 | P15 |
| Feature 2 | P24 | P25 | P21 | P25 | P23 | P22 | P25 | P21 | P24 | P24 |
| Distances (D3) | 0.149 | 0.289 | 1.069 | 0.557 | 0.167 | 0.972 | 0.319 | 0.897 | 0.680 | 0.065 |

$D_3 = \sqrt{D_1^2 + D_2^2}$

Output = L10

Preferably, according to the present invention, the means for comparing feature vector signals to prototype vector signals comprises means for comparing the value of the first feature of a feature vector signal with the parameter of each first-dimension prototype vector signal exactly one time only, and means for comparing the value of the second feature of a feature vector signal with the parameter value of each second-dimension prototype vector signal exactly one time only. In the hypothetical example shown in Table 4, the Feature 1 value of feature vector U1 is compared with the parameter value of each first-dimension prototype vector P11, P12, P13, P14, and P15 exactly one time only. The Feature 2 value of feature vector U1 is compared with the parameter value of each second-dimension prototype vector P21, P22, P23, P24 and P25 exactly one time only.

The single-dimension prototype match scores in the hypothetical example of Table 4 are simple Euclidean distances. Preferably, however, each single-dimension prototype vector comprises a mean value $\mu$ and a standard deviation $\sigma$. In this case each single-dimension prototype vector is modelled as a Gaussian distribution, so that the prototype match score for each single-dimension prototype vector is given by equation 8, $$D(x_i) = -2 \ln \left[ \frac{1}{\sqrt{2\pi\sigma^2}} e^{-\frac{1}{2}(\frac{x-\mu}{\sigma})^2} \right] \quad [8]$$

where $x_i$ is the value of the i-th feature (dimension) of Feature Vector X. (When $\sigma=1$, the prototype match score is the Euclidean distance plus a constant.)

In this Example, the compound-dimension prototype match scores are based on the assumption that the compound-dimension prototypes are equally likely. Preferably, however, each compound-dimension prototype match score includes a component representing the estimated prior probability of occurrence of the compound-dimension prototype.

The single-dimension prototype vector signals and compound-dimension prototype vector signals according to the present invention may be obtained from a set of initial multidimensional prototype vectors. The initial multidimensional prototype vectors may be obtained, for example, by clustering feature vector signals from a training set into a plurality of clusters, and then calculating the means and standard deviation for each cluster. When the training script comprises a series of word-segment models (forming a model of a series of words), and each word-segment model comprises a series of elementary models having specified locations in the word-segment models, the feature vector signals may be clustered by specifying that each cluster corresponds to a single elementary model in a single location in a single word-segment model. Such a method is described in more detail in U.S. patent application Ser. No. 730,714, filed on Jul. 16, 1991, entitled "Fast Algorithm for Deriving Acoustic Prototypes for Automatic Speech Recognition."

Alternatively, all acoustic feature vectors generated by the utterance of a training text and which correspond to a given elementary model may be clustered by K-means Euclidean clustering or K-means Gaussian clustering, or both. Such a method is described, for example, in U.S. patent application Ser. No. 673,810, filed on Mar. 22, 1991 entitled "Speaker-Independent Label Coding Apparatus".

Table 5 shows a hypothetical example of initial prototype vectors L1 through L10. Each of the initial prototype vectors has a Feature 1 parameter value, and a Feature 2 parameter value. No two of the initial prototype vectors have the same Feature 1 parameter value or the same Feature 2 parameter value.

TABLE 5

| | INITIAL PROTOTYPE VECTORS | | | | | | | | | |
|---|---|---|---|---|---|---|---|---|---|---|
| Labels | L1 | L2 | L3 | L4 | L5 | L6 | L7 | L8 | L9 | L10 |
| Feature 1 | 0.68 | 0.94 | 0.01 | 0.43 | 0.84 | 0.02 | 0.77 | 0.19 | 0.27 | 1.0 |
| Feature 2 | 0.69 | 0.88 | 0.01 | 0.92 | 0.56 | 0.26 | 0.97 | 0.1 | 0.65 | 0.66 |

The Feature 1 single-dimension prototype vectors shown in Table 2 can be obtained from the initial prototype vectors of Table 5 by clustering the Feature 1 prototype values of the initial prototype vectors. The Feature 2 single-dimension prototype vectors of Table 2 can be obtained by clustering the Feature 2 values of the initial prototype vectors of Table 5.

Tables 6 and 7 are hypothetical examples of the clustering of the Feature 1 and Feature 2 values, respectively, of the initial prototype vectors of Table 5.

TABLE 6

| CLUSTER THE FEATURE 1 VALUES | | | | | | | | | | |
|---|---|---|---|---|---|---|---|---|---|---|
| Labels | L3 | L6 | L8 | L9 | L4 | L1 | L7 | L5 | L2 | L10 |
| Feature 1 Values | 0.01 | 0.02 | 0.19 | 0.27 | 0.43 | 0.68 | 0.77 | 0.84 | 0.94 | 1.0 |
| Distances | 0.01 | 0.17 | 0.08 | 0.16 | 0.25 | 0.09 | 0.07 | 0.10 | 0.06 | |
| Labels | L3,L6 | L8 | L9 | L4 | L1 | L7 | L5 | L2 | L10 | |
| Feature 1 Values | 0.015 | 0.19 | 0.27 | 0.43 | 0.68 | 0.77 | 0.84 | 0.94 | 1.0 | |

TABLE 6-continued

| CLUSTER THE FEATURE 1 VALUES | | | | | | | | |
|---|---|---|---|---|---|---|---|---|
| Distances | 0.18 | 0.08 | 0.16 | 0.25 | 0.09 | 0.07 | 0.10 | 0.06 |
| Labels | L3,L6 | L8 | L9 | L4 | L1 | L7 | L5 | L2,L10 |
| Feature 1 Values | 0.015 | 0.19 | 0.27 | 0.43 | 0.68 | 0.77 | 0.84 | 0.97 |
| Distances | 0.18 | 0.08 | 0.16 | 0.25 | 0.09 | 0.07 | 0.13 | |
| Labels | L3,L6 | L8 | L9 | L4 | L1 | L7,L5 | L2,L10 | |
| Feature 1 Values | 0.015 | 0.19 | 0.27 | 0.43 | 0.68 | 0.805 | 0.97 | |
| Distances | 0.18 | 0.08 | 0.16 | 0.25 | 0.13 | 0.16 | | |
| Labels | L3,L6 | L8,L9 | L4 | L1 | L7,L5 | L2,L10 | | |
| Feature 1 Values | 0.015 | 0.23 | 0.43 | 0.68 | 0.805 | 0.97 | | |
| Distances | 0.18 | 0.20 | 0.25 | 0.13 | 0.16 | | | |
| Labels | L3,L6 | L8,L9 | L4 | L1,L7,L5 | L2,L10 | | | |
| Feature 1 Values | 0.015 | 0.23 | 0.43 | 0.763 | 0.97 | | | |

As shown in Table 6, the initial prototype vectors L1 through L10 are arranged from lowest to highest according to their Feature 1 parameter values. The distances between adjacent prototype vectors are calculated, and the closest prototype vectors are merged. The merged vector has a Feature 1 parameter value consisting of the average of the Feature 1 parameter values of the components thereof. The process is repeated until, for example, there are only a preselected number of clusters.

Table 7 shows a similar process for clustering the Feature 2 values of the initial prototype vectors to produce second-dimension prototype vector signals.

TABLE 7

| CLUSTER THE FEATURE 2 VALUES | | | | | | | | | |
|---|---|---|---|---|---|---|---|---|---|
| Labels | L3 | L8 | L6 | L5 | L9 | L10 | L1 | L2 | L4 | L7 |
| Feature 2 Values | 0.01 | 0.1 | 0.26 | 0.56 | 0.65 | 0.66 | 0.69 | 0.88 | 0.92 | 0.97 |
| Distances | 0.09 | 0.16 | 0.3 | 0.09 | 0.01 | 0.03 | 0.19 | 0.04 | 0.05 | |
| Labels | L3 | L8 | L6 | L5 | L9 | L10,L1 | L2 | L4 | L7 | |
| Feature 2 Values | 0.01 | 0.1 | 0.26 | 0.56 | 0.65 | 0.675 | 0.88 | 0.92 | 0.97 | |
| Distances | 0.09 | 0.16 | 0.3 | 0.09 | 0.02 | 0.20 | 0.04 | 0.05 | | |
| Labels | L3 | L8 | L6 | L5 | L9,L10,L1 | L2 | L4 | L7 | | |
| Feature 2 Values | 0.01 | 0.1 | 0.26 | 0.56 | 0.666 | 0.88 | 0.92 | 0.97 | | |
| Distances | 0.09 | 0.16 | 0.3 | 0.10 | 0.21 | 0.04 | 0.05 | | | |
| Labels | L3 | L8 | L6 | L5 | L9,L10,L1 | L2,L4 | L7 | | | |
| Feature 2 Values | 0.01 | 0.1 | 0.26 | 0.56 | 0.666 | 0.9 | 0.97 | | | |
| Distances | 0.09 | 0.16 | 0.3 | 0.10 | 0.23 | 0.07 | | | | |
| Labels | L3 | L8 | L6 | L5 | L9,L10,L1 | L2,L4,L7 | | | | |
| Feature 2 Values | 0.01 | 0.1 | 0.26 | 0.56 | 0.666 | 0.923 | | | | |
| Distances | 0.09 | 0.16 | 0.3 | 0.10 | 0.25 | | | | | |
| Labels | L3,L8 | L6 | L5 | L9,L10,L1 | L2,L4,L7 | | | | | |
| Feature 2 Values | 0.055 | 0.26 | 0.56 | 0.666 | 0.923 | | | | | |

In practice, acoustic feature vectors produced by the utterance of a training text may be clustered into, for example, 2,500 clusters represented by 2,500 initial prototype vectors of fifty dimensions each. Each dimension may be clustered to form, for example, forty single-dimension prototype vectors, each having a mean and a standard deviation of a Gaussian distribution. In this case, the distance between two clusters may be given by Equation 9.

$$D(1,2) = \frac{\left(\frac{1}{\sigma_1}\right)^n \left(\frac{1}{\sigma_2}\right)^m}{\left(\frac{1}{\sigma_3}\right)^{n+m}} \quad [9]$$

where $\sigma_1$ is the standard deviation of the first cluster, $\sigma_2$ is the standard deviation of the second cluster, $\sigma_3$ is the standard deviation of the combined clusters, n is the number of feature vectors contained in the first cluster, and m is the number of feature vectors contained in the second cluster.

Returning to FIG. 1, the speech recognition apparatus according to the present invention further includes means 42 for generating a match score for each of a plurality of speech units. Each match score comprises an estimate of the closeness of a match between the speech unit and the sequence of coded representations of the utterance. Each speech unit comprises one or more subunits.

The means 42 for generating match scores for speech units may comprise any known acoustic match processors and/or language model processors, such as described in U.S. Pat. No. 4,980,918, discussed above.

Means 44 according to the present invention are provided for identifying one or more best candidate speech units having the best match scores. Means 46 are provided for displaying or otherwise outputting at least one speech subunit of one or more of the best candidate speech units.

The processors 40, 42 and 44 of the speech coding and speech recognition apparatus according to the invention may be made by suitably programming either a special purpose or a general purpose digital computer system. Stores 36 and 38 may be electronic computer memory. The display 46 may be a video display, such as a cathode ray tube, a liquid crystal display, or a printer. Alternatively, the output means may be an audio output device, such as a speech synthesizer having a loudspeaker or headphones.

A speech coding apparatus according to the present invention having a plurality of single-dimension prototype vector signals, and having a plurality of compound-dimension prototype vector signals made up of single-dimension prototype vector signals can quickly and efficiently find the prototype vector signal which is best matched to a given feature vector signal by using the following algorithm. First, the distance is calculated between each single-dimension prototype vector signal and the corresponding dimension of the feature vector signal. The minimum distance for each dimension is then identified.

Next, the distance is calculated between a first compound-dimension prototype vector and the feature vector. Preferably, the first compound-dimension prototype vector is the prototype vector having the best prototype match score for the immediately preceding feature vector signal, and this distance is obtained prior to comparing the feature value of the uncoded feature vector signal to the parameter values of other prototype vector signals. This distance is the best prototype match score found so far.

For a second compound-dimension prototype vector, a partial prototype match score is obtained by calculating the distance between one dimension of the second compound-dimension prototype vector and the corresponding dimension of the feature vector. To the partial prototype match score is added a remainder match score comprising the previously obtained minimum distances for the remaining dimensions. If the sum is worse than the best prototype match score found so far, then the prototype vector is discarded without performing any further distance calculations for the remaining dimensions of the prototype vector. Otherwise, the distance between the next dimension of the second compound-dimension prototype vector and the corresponding dimension of the feature vector is combined with the partial prototype match score, and the process is repeated.

Alternatively, the remainder match score may be obtained in the following manner. The minimum distances for the remaining dimensions forms a first minimum remainder prototype match score. The closeness between the second part of a second feature vector signal, corresponding to the remaining dimensions, and the closest corresponding single-dimension prototype vector signals forms a second minimum remainder prototype match score. The closeness between the second part of the second feature vector signal and a corresponding second part of a second compound-dimension prototype vector signal having the best prototype match score with the second feature vector signal forms a prior reference remainder prototype match score. Finally, a weighted combination of the first minimum remainder prototype match score with the excess of the prior reference remainder match score over the second minimum remainder prototype match score forms an estimate of the best remainder match score.

We claim:

1. A speech coding apparatus comprising:
   means for measuring the values of at least first and second different features of an utterance during each of a series of successive time intervals to produce a series of feature vector signals representing the feature values;
   means for storing a plurality of single-dimension prototype vector signals, each single-dimension prototype vector signal having at least one parameter value, at least two single-dimension prototype vector signals being first-dimension prototype vector signals having parameter values representing first feature values, at least two other single-dimension prototype vector signals being second-dimension prototype vector signals having parameter values representing second feature values;
   means for storing a plurality of compound-dimension prototype vector signals, each compound-dimension prototype vector signal having a unique identification value, each compound-dimension prototype vector signal comprising one first-dimension prototype vector signal and one second-dimension prototype vector signal, at least two compound-dimension prototype vector signals comprising the same first-dimension prototype vector signal;
   means for comparing the closeness of the feature values of a feature vector signal to the parameter values of the compound-dimension prototype vector signals to obtain prototype match scores for the feature vector signal and each compound-dimension prototype vector signal; and
   means for outputting at least the identification value of the compound-dimension prototype vector signal having the best prototype match score as a coded representation signal of the feature vector signal.

2. A speech coding apparatus as claimed in claim 1, characterized in that the means for comparing comprises:
   means for comparing the value of the first feature of a feature vector signal with the parameter value of each first-dimension prototype vector signal exactly one time only; and
   means for comparing the value of the second feature of a feature vector signal with the parameter value of each second-dimension prototype vector signal exactly one time only.

3. A speech coding apparatus as claimed in claim 2, characterized in that a plurality of single-dimension prototype vector signals are contained in two or more compound-dimension prototype vector signals.

4. A speech coding apparatus as claimed in claim 3, characterized in that each compound-dimension prototype vector signal contains at least one single-dimension prototype vector signal which is also contained in at least some other compound-dimension prototype vector signal.

5. A speech coding apparatus as claimed in claim 4, characterized in that for each dimension, the number of single-dimension prototype vector signals is less than one-half the number of compound-dimension prototype vector signals.

6. A speech coding apparatus as claimed in claim 1, characterized in that the measuring means comprises a microphone.

7. A speech coding apparatus as claimed in claim 1, characterized in that the comparison means comprises:
   means for comparing the closeness of the feature values of a first feature vector signal to the parameter values of a first compound-dimension prototype vector signal to obtain a prototype match score for the feature vector signal and the first compound-dimension prototype vector signal;
   means for comparing the closeness between the parameter values of a first part of a second compound-dimension prototype vector signal and the feature values of a corresponding first part of the first feature vector signal to obtain a partial prototype match score for the second compound-dimension prototype vector signal and the first feature vector signal; and
   means for selecting the first compound-dimension prototype vector signal as better than the second compound-dimension prototype vector signal if the prototype match score for the first feature vector signal and the first compound-dimension prototype vector signal is better than the partial prototype match score for the second compound-dimension prototype vector signal and the first feature vector signal.

8. A speech coding apparatus as claimed in Claim 7, characterized in that the comparison means further comprises:
  means for estimating a best remainder prototype match score for the feature values of a second part of the feature vector signal different from the first part of the feature vector signal; and
  means for selecting the first compound-dimension prototype vector signal as better than the second compound-dimension prototype vector signal if the prototype match score for the first feature vector signal and the first compound-dimension prototype vector signal is better than the sum of the partial prototype match score and the best remainder prototype match score.

9. A speech coding apparatus as claimed in Claim 8, characterized in that the means for estimating the best remainder prototype match score comprises:
  means for comparing the closeness between the second part of the first feature vector signal and the closest corresponding single-dimension prototype vector signals to obtain a first minimum remainder prototype match score;
  means for comparing the closeness between the second part of a second feature vector signal, corresponding to the second part of the first feature vector signal, and the closest corresponding single-dimension prototype vector signals to obtain a second minimum remainder prototype match score;
  means for comparing the closeness between the second part of the second feature vector signal and a corresponding second part of a second compound-dimension prototype vector signal having the best prototype match score with the second feature vector signal to obtain a prior reference remainder prototype match score;
  means for combining, by weighted combination, the first minimum remainder prototype match score with the excess of the prior reference remainder match score over the second minimum remainder prototype match score to estimate the best remainder match score.

10. A method of speech coding comprising the steps of:
  measuring the values of at least first and second different features of an utterance during each of a series of successive time intervals to produce a series of feature vector signals representing the feature values;
  storing a plurality of single-dimension prototype vector signals, each single-dimension prototype vector signal having at least one parameter value, at least two single-dimension prototype vector signals being first-dimension prototype vector signals having parameter values representing first feature values, at least two other single-dimension prototype vector signals being second-dimension prototype vector signals having parameter values representing second feature values;
  storing a plurality of compound-dimension prototype vector signals, each compound-dimension prototype vector signal having a unique identification value, each compound-dimension prototype vector signal comprising one first-dimension prototype vector signal and one second-dimension prototype vector signal, at least two compound-dimension prototype vector signals comprising the same first-dimension prototype vector signal;
  comparing the closeness of the feature values of a feature vector signal to the parameter values of the compound-dimension prototype vector signals to obtain prototype match scores for the feature vector signal and each compound-dimension prototype vector signal; and
  outputting at least the identification value of the compound-dimension prototype vector signal having the best prototype match score as a coded representation signal of the feature vector signal.

11. A speech coding method as claimed in Claim 10, characterized in that the step of comparing comprises:
  comparing the value of the first feature of a feature vector signal with the parameter value of each first-dimension prototype vector signal exactly one time only; and
  comparing the value of the second feature of a feature vector signal with the parameter value of each second-dimension prototype vector signal exactly one time only.

12. A speech coding apparatus as claimed in Claim 11, characterized in that a plurality of single-dimension prototype vector signals are contained in two or more compound-dimension prototype vector signals.

13. A speech coding method as claimed in Claim 12, characterized characterized in that each compound-dimension prototype vector signal contains at least one single-dimension prototype vector signal which is also contained in at least some other compound-dimension prototype vector signal.

14. A speech coding method as claimed in Claim 13, characterized in that for each dimension, the number of single-dimension prototype vector signals is less than one-half the number of compound-dimension prototype vector signals.

15. A speech recognition apparatus comprising:
  means for measuring the values of at least first and second different features of an utterance during each of a series of successive time intervals to produce a series of feature vector signals representing the feature values;
  means for storing a plurality of single-dimension prototype vector signals, each single-dimension prototype vector signal having at least one parameter value, at least two single-dimension prototype vector signals being first-dimension prototype vector signals having parameter values representing first feature values, at least two other single-dimension prototype vector signals being second-dimension prototype vector signals having parameter values representing second feature values;
  means for storing a plurality of compound-dimension prototype vector signals, each compound-dimension prototype vector signal having a unique identification value, each compound-dimension prototype vector signal comprising one first-dimension prototype vector signal and one second-dimension prototype vector signal, at least two compound-dimension prototype vector signals comprising the same first-dimension prototype vector signal;

means for comparing the closeness of the feature values of each feature vector signal to the parameter values of the compound-dimension prototype vector signals to obtain prototype match scores for each feature vector signal and each compound-dimension prototype vector signal;

means for outputting the identification values of the compound-dimension prototype vector signals having the best prototype match scores for the feature vector signals as a sequence of coded representations of an utterance to be recognized;

means for generating a match score for each of a plurality of speech units, each match score comprising an estimate of the closeness of a match between the speech unit and the sequence of coded representations of the utterance, each speech unit comprising one or more speech subunits;

means for identifying one or more best candidate speech units having the best match scores; and means for outputting at least one speech subunit of one or more of the best candidate speech units.

16. A speech recognition apparatus as claimed in Claim 15, characterized in that the means for comparing comprises:

means for comparing the value of the first feature of a feature vector signal with the parameter value of each first-dimension prototype vector signal exactly one time only; and means for comparing the value of the second feature of a feature vector signal with the parameter value of each second-dimension prototype vector signal exactly one time only.

17. A speech recognition apparatus as claimed in Claim 16, characterized in that a plurality of single-dimension prototype vector signals are contained in two or more compound-dimension prototype vector signals.

18. A speech recognition apparatus as claimed in Claim 17, characterized in that each compound-dimension prototype vector signal contains at least one single-dimension prototype vector signal which is also contained in at least some other compound-dimension prototype vector signal.

19. A speech recognition apparatus as claimed in Claim 18, characterized in that for each dimension, the number of single-dimension prototype vector signals is less than one-half the number of compound-dimension prototype vector signals.

20. A speech recognition apparatus as claimed in Claim 15, characterized in that the measuring means comprises a microphone.

21. A speech recognition apparatus as claimed in Claim 15, characterized in that the means for outputting at least one speech subunit comprises a display.

22. A speech recognition apparatus as claimed in Claim 15, characterized in that the means for outputting at least one speech subunit comprises a speech synthesizer.

23. A speech recognition method comprising:

measuring the values of at least first and second different features of an utterance during each of a series of successive time intervals to produce a series of feature vector signals representing the feature values;

storing a plurality of single-dimension prototype vector signals, each single-dimension prototype vector signal having at least one parameter value, at least two single-dimension prototype vector signals being first-dimension prototype vector signals having parameter values representing first feature values, at least two other single-dimension prototype vector signals being second-dimension prototype vector signals having parameter values representing second feature values;

storing a plurality of compound-dimension prototype vector signals, each compound-dimension prototype vector signal having a unique identification value, each compound-dimension prototype vector signal comprising one first-dimension prototype vector signal and one second-dimension prototype vector signal, at least two compound-dimension prototype vector signals comprising the same first-dimension prototype vector signal;

comparing the closeness of the feature values of each feature vector signal to the parameter values of the compound-dimension prototype vector signals to obtain prototype match scores for each feature vector signal and each compound-dimension prototype vector signal;

outputting the identification values of the compound-dimension prototype vector signals having the best prototype match scores for the feature vector signals as a sequence of coded representations of an utterance to be recognized;

generating a match score for each of a plurality of speech units, each match score comprising an estimate of the closeness of a match between the speech unit and the sequence of coded representations of the utterance, each speech unit comprising one or more speech subunits;

identifying one or more best candidate speech units having the best match scores; and outputting at least one speech submit of one or more of the best candidate speech units.

24. A speech recognition method as claimed in Claim 23, characterized in that the step of comparing comprises:

comparing the value of the first feature of a feature vector signal with the parameter value of each first-dimension prototype vector signal exactly one time only; and comparing the value of the second feature of a feature vector signal with the parameter value of each second-dimension prototype vector signal exactly one time only.

25. A speech recognition method as claimed in Claim 24, characterized in that a plurality of single-dimension prototype vector signals are contained in two or more compound-dimension prototype vector signals.

26. A speech recognition method as claimed in Claim 25, characterized in that each compound-dimension prototype vector signal contains at least one single-dimension prototype vector signal which is also contained in at least some other compound-dimension prototype vector signal.

27. A speech recognition method as claimed in Claim 26, characterized in that for each dimension, the number of single-dimension prototype vector signals is less than one-half the number of compound-dimension prototype vector signals.

28. A speech coding apparatus comprising:

means for measuring the value of at least a first feature of an utterance during each of a series of successive time intervals to produce a series of feature vector signals representing the feature values;

means for storing a plurality of prototype vector signals, each prototype vector signal having at least one parameter value representing a first feature value and having a unique identification value;

means for comparing the closeness of the feature value of a feature vector signal to the parameter values of the prototype vector signals to obtain prototype match scores for the feature vector signal and each prototype vector signal; and means for outputting at least the identification value of the prototype vector signal having the best prototype match score as a coded representation signal of the feature vector signal;

characterized in that the comparison means comprises means for comparing the closeness of the feature value of an uncoded feature vector signal to the parameter value of the prototype vector signal having the best prototype match score for an immediately preceding feature vector signal prior to comparing the feature value of the uncoded feature vector signal to the parameter values of other prototype vector signals.

* * * * *